US012610783B2

(12) United States Patent
Araki et al.

(10) Patent No.: US 12,610,783 B2
(45) Date of Patent: Apr. 21, 2026

(54) SUBSTRATE TRANSFER APPARATUS, STATE DETERMINATION METHOD, AND COMPUTER STORAGE MEDIUM

(71) Applicant: Tokyo Electron Limited, Tokyo (JP)

(72) Inventors: Ryo Araki, Koshi (JP); Junnosuke Maki, Koshi (JP); Mitsuteru Yano, Koshi (JP); Masato Hayashi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1066 days.

(21) Appl. No.: 17/701,068

(22) Filed: Mar. 22, 2022

(65) Prior Publication Data

US 2022/0310438 A1 Sep. 29, 2022

(30) Foreign Application Priority Data

Mar. 29, 2021 (JP) ................................. 2021-054897

(51) Int. Cl.
　*H01L 21/683* (2006.01)
　*H01L 21/67* (2006.01)
　*H01L 21/677* (2006.01)
(52) U.S. Cl.
　CPC .... *H01L 21/6838* (2013.01); *H01L 21/67265* (2013.01); *H01L 21/67778* (2013.01)
(58) Field of Classification Search
　CPC ........... H01L 21/6838; H01L 21/67265; H01L 21/67778; H01L 21/67259; H01L 21/67766; H01L 21/68707; H01L 21/67253; G01D 21/02; B25J 11/0095; B25J 19/02
　See application file for complete search history.

(56) References Cited

U.S. PATENT DOCUMENTS

| | | | | |
|---|---|---|---|---|
| 6,062,241 | A | * 5/2000 | Tateyama | ............. B25J 15/0616 |
| | | | | 134/133 |
| 6,788,991 | B2 * | 9/2004 | De Haas | ........... H01L 21/67288 |
| | | | | 700/121 |
| 10,211,085 | B2 * | 2/2019 | Ogliari | ................ C23C 16/4582 |
| 10,882,192 | B2 * | 1/2021 | Cui | ........................ B65G 47/91 |
| 11,920,240 | B2 * | 3/2024 | Araki | ................ H01L 21/67178 |
| 2016/0001449 | A1 * | 1/2016 | Pergande | ............. B25J 15/0019 |
| | | | | 156/60 |

FOREIGN PATENT DOCUMENTS

| | | | | |
|---|---|---|---|---|
| CN | 106024567 A | * 10/2016 | | ........... C23C 16/513 |
| JP | H08-335622 A | 12/1996 | | |

* cited by examiner

*Primary Examiner* — Stephen A Vu
(74) *Attorney, Agent, or Firm* — Posz Law Group, PLC

(57) ABSTRACT

An apparatus transfers a substrate. The apparatus includes: one substrate holder adsorbing and holding the substrate via an adsorption port; a nozzle being provided on a surface of the one substrate holder and allowing gas to pass therethrough; an adsorption flow path being connected to the adsorption port and allowing gas to flow therethrough; and a nozzle flow path being connected to the nozzle and allowing the gas to flow therethrough. The adsorption flow path of at least one of the one substrate holder and another substrate holder and the nozzle flow path are connected to a common gas suction mechanism. A pressure sensor and flow rate sensor are provided for the nozzle flow path. The flow rate of the nozzle flow path is varied according to a distance between an interferer and the one substrate holder and the pressure of the nozzle flow path.

20 Claims, 13 Drawing Sheets

DIAMETER OF PASSAGE HOLE OF
NOZZLE: 2 mm
EXHAUST PRESSURE: −20kPa

DIAMETER OF PASSAGE HOLE OF
NOZZLE: 2 mm
EXHAUST PRESSURE: −10kPa

DIAMETER OF PASSAGE HOLE OF
NOZZLE: 1 mm
EXHAUST PRESSURE: −20kPa

DIAMETER OF PASSAGE HOLE OF
NOZZLE 1 mm:
EXHAUST PRESSURE: −10kPa

SUBSTRATE TRANSFER APPARATUS, STATE DETERMINATION METHOD, AND COMPUTER STORAGE MEDIUM

CROSS REFERENCE TO RELATED APPLICATIONS

This application is based upon and claims the benefit of priority of the prior Japanese Patent Application No. 2021-54897, filed in Japan on Mar. 29, 2021, the entire contents of which are incorporated herein by reference.

TECHNICAL FIELD

This disclosure relates to a substrate transfer apparatus, a state determination method, and a computer storage medium.

BACKGROUND

Japanese Laid-open Patent Publication No. H8-335622 discloses a substrate transfer apparatus which transfers a substrate between a wafer boat which supports a plurality of substrates and a carrier. This substrate transfer apparatus includes: a transfer apparatus main body movable between a first transfer work position where a transfer work can be performed with respect to the wafer boat and a second transfer work position where the transfer work can be performed with respect to the carrier; a fork provided to be movable with respect to the transfer apparatus main body, for delivering the substrate to/from substrate supporters of the wafer boat and the carrier; and capacitive sensors which are attached to both side parts of the fork and move back and forth integrally with the fork to detect a distance to the substrate and a position of the substrate within a horizontal plane.

SUMMARY

One aspect of this disclosure is a substrate transfer apparatus which transfers a substrate, the substrate transfer apparatus including: one substrate holder configured to be able to adsorb and hold the substrate via an adsorption port; a nozzle provided on a surface of the one substrate holder and configured to allow gas to pass therethrough; an adsorption flow path connected to the adsorption port and configured to allow gas to flow therethrough at an adsorption time; a nozzle flow path connected to the nozzle and configured to allow the gas to flow therethrough, the adsorption flow path of at least one of the one substrate holder and another substrate holder and the nozzle flow path being connected to a common gas suction mechanism; a pressure sensor configured to measure a pressure of the gas flowing through the nozzle flow path; and a flow rate sensor configured to measure a flow rate of the gas flowing through the nozzle flow path, the flow rate varying according to a distance between an interferer and the one substrate holder and the pressure of the gas flowing through the nozzle flow path.

DETAILED DESCRIPTION

Figure 1:
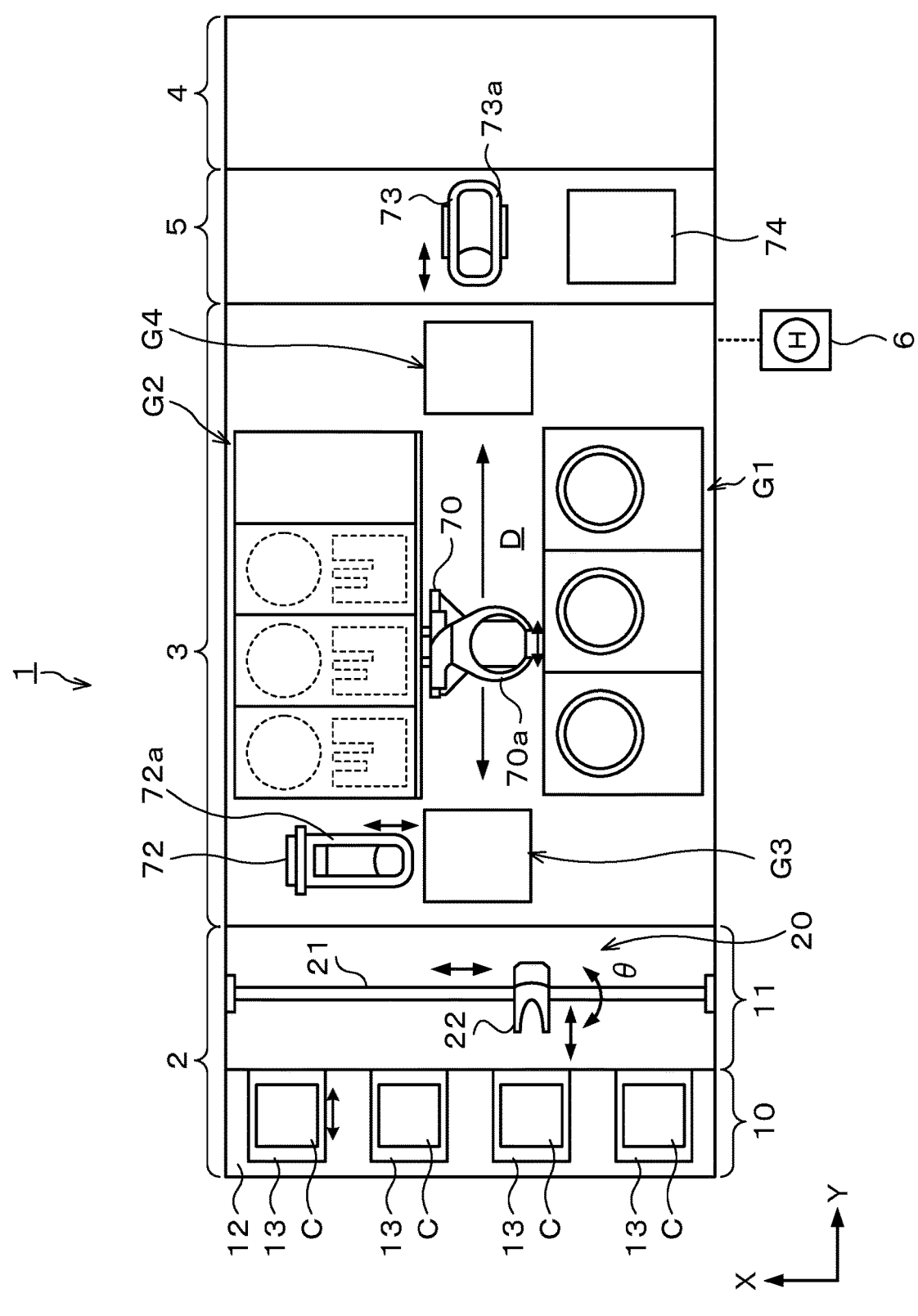
FIG. 1 is an explanatory view illustrating the outline of an internal configuration of a wafer processing system including a wafer transfer apparatus as a substrate transfer apparatus according to this embodiment.

Conventionally, in a manufacturing process of a semiconductor device or the like, various substrate processing systems such as a coating and developing treatment system which performs a series of photolithography processing such as resist coating treatment, exposure processing, developing treatment and so on, for example, on a semiconductor wafer (hereinafter, referred to as a "wafer"), an etching treatment system which performs an etching treatment on the wafer are used.

Generally, in the substrate processing system, a substrate transfer apparatus which transfers the substrate is provided. The substrate transfer apparatus has a fork which is a substrate holder for sucking and holding the substrate, and the fork is configured to be movable. In the substrate transfer apparatus, the fork sucking and holding the wafer is moved to be able to, for example, transfer the substrate to a desired position.

Incidentally, the fork, when moved, sometimes comes into contact with the substrate, a structure or the like around the fork. For example, at the time when the fork is inserted into a cassette housing a plurality of substrates in order to deliver the substrate, the fork unintentionally comes into contact with the substrate located below it. As a matter of course, its design and so on are made so as not to cause the unintentional contact but, for example, a failure in a motor or a speed reducer, an aging of a drive belt or the like in a drive system of the substrate transfer apparatus may cause a positional displacement of the fork. When the sufficient distance between the fork and the substrate is lost due to this positional displacement, the fork largely vibrates to come into contact with the substrate in some cases depending on the relation with its resonant frequency when the fork is moved at high speed or the like.

The occurrence of the contact of the fork is a problem because a breakage of the contact substrate or structure, the generation of particles or the like occurs. Besides, in the case where the fork comes into contact with the surroundings, it is necessary to appropriately cope with the contact by the adjustment of moving conditions of the fork, the replacement or discard of the fork and the substrate or structure to which the fork comes into contact or the like. Therefore, a method of determining the occurrence of the contact or approach of the fork with/to the interferer, namely, a state determination method of making a determination on a state of a distance between the fork and the interferer to which the fork possibly comes into contact is under consideration.

A conceivable method of the above state determination method is the one using, for example, a capacitive sensor attached to the fork. This method measures the capacitance between a sensor part of the capacitive sensor and the interferer to which the fork possibly comes into contact (namely, which possibly interferes with the fork) to determine the contact or the like between the fork and the interferer based on the measurement result. However, the capacitance between the sensor part and the interferer largely varies depending on the property of the material of the interferer such as the conductivity, permittivity, or the like of the interferer. Therefore, the above method using the capacitive sensor cannot appropriately make the determination on the state of the distance between the fork and the interferer in some cases.

Hence, the technique according to this disclosure accurately makes a determination on a state of a distance between a substrate holder which sucks and holds a substrate of a substrate transfer apparatus and an interferer.

Hereinafter, a substrate transfer apparatus and a state determination method according to this embodiment will be explained referring to the drawings. Note that the same codes are given to components having substantially the same functional configurations in the description and the drawings to omit duplicated explanation.

<Wafer Processing System>

Figure 2:
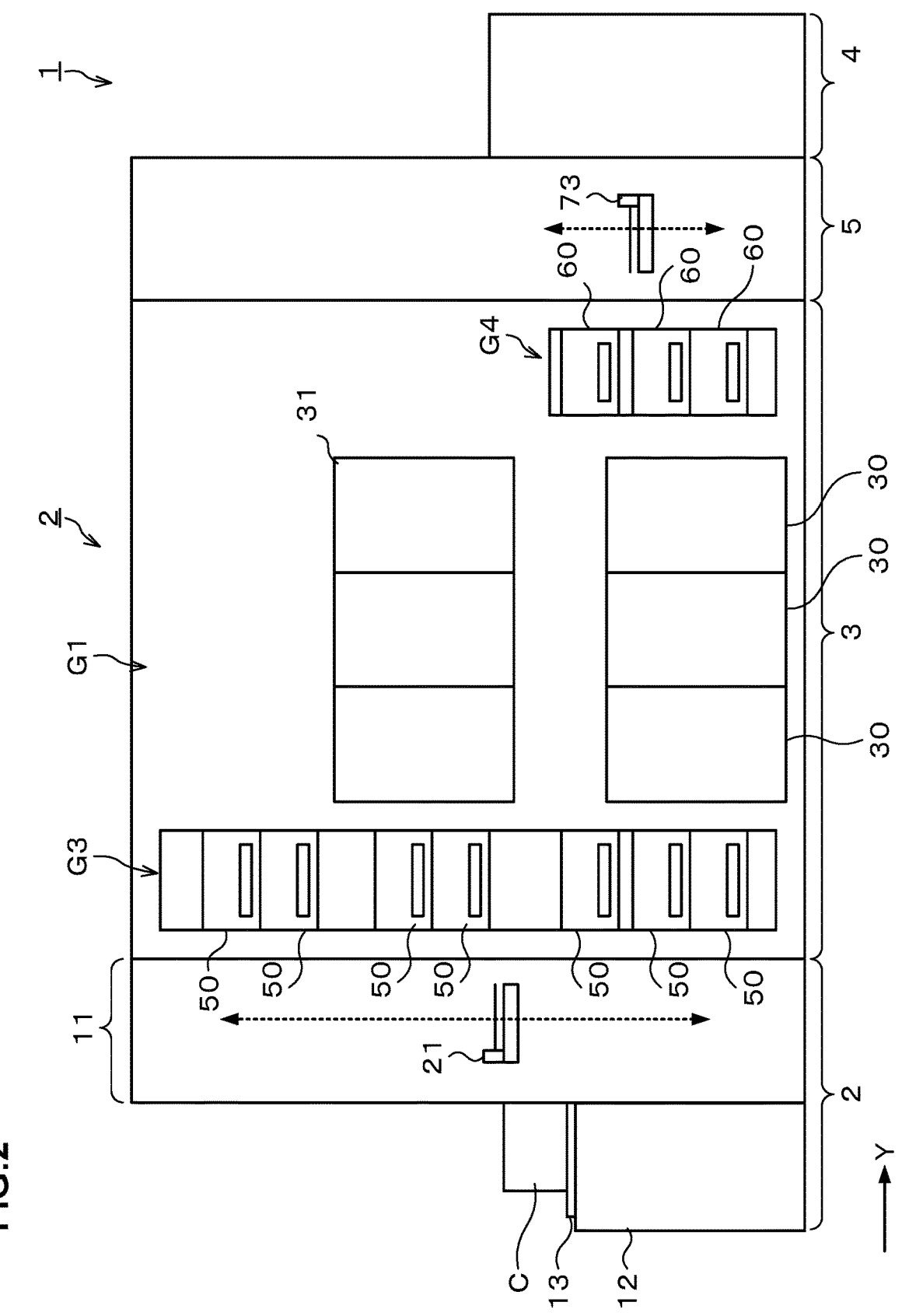
FIG. 2 is a view illustrating the outline of the internal configuration on the front side of the wafer processing system.
Figure 3:
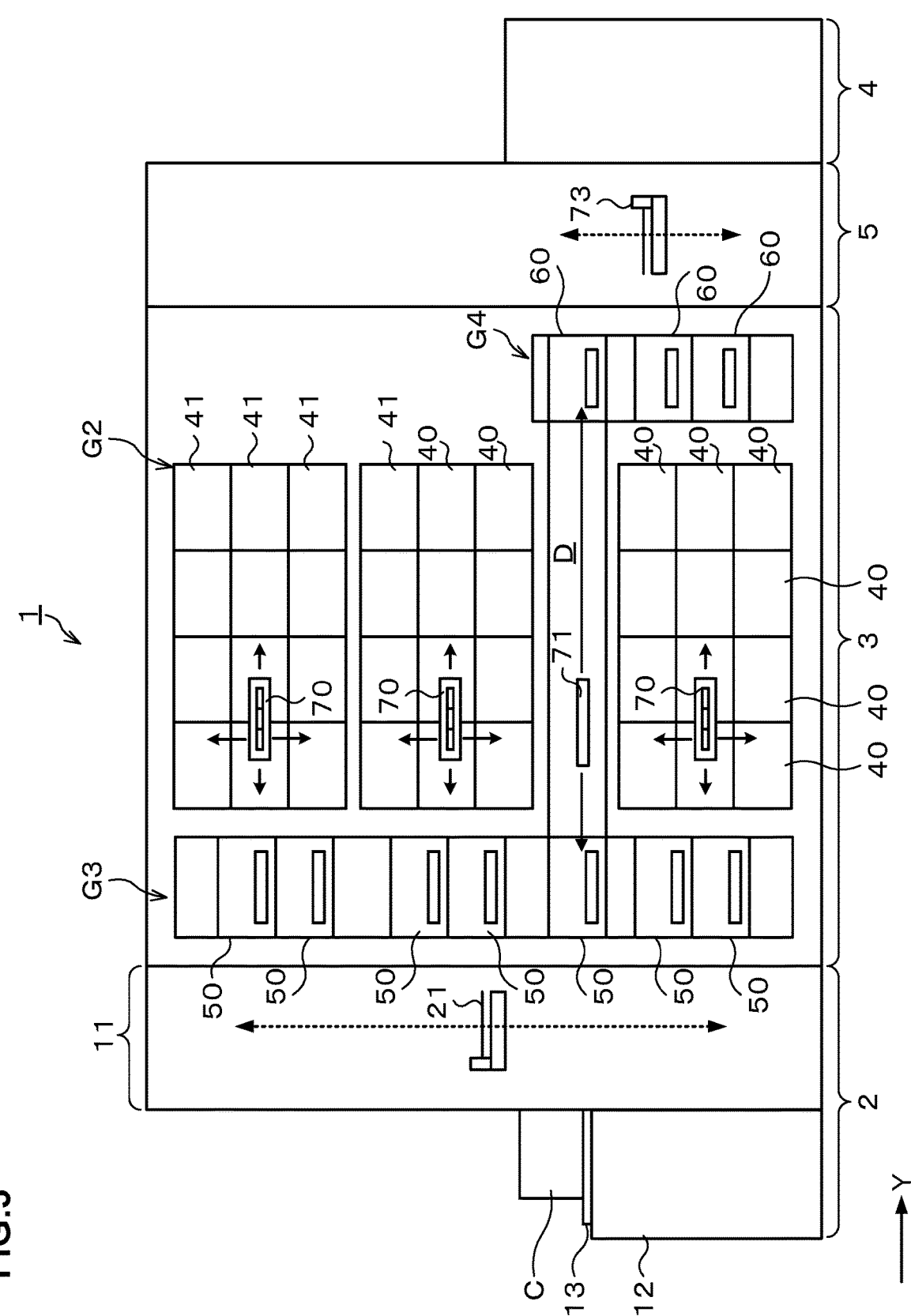
FIG. 3 is a view illustrating the outline of the internal configuration on the rear side of the wafer processing system.

FIG. 1 is an explanatory view illustrating the outline of an internal configuration of a wafer processing system 1 including a wafer transfer apparatus as the substrate transfer apparatus according to this embodiment. FIG. 2 and FIG. 3 are views illustrating the outline of the internal configuration on the front side and the rear side of the wafer processing system 1, respectively.

The wafer processing system 1 has a cassette station 2 into/out of which a cassette C being a container capable of storing a plurality of wafers as substrates is transferred, and a processing station 3 including a plurality of various processing apparatuses which perform predetermined processing such as resist coating treatment, PEB processing and so on, as illustrated in FIG. 1.

Further, the wafer processing system 1 has a configuration in which the cassette station 2, the processing station 3, and an interface station 5 which performs delivery of the wafer W to/from an exposure apparatus 4 adjacent to the processing station 3 are integrally connected. The wafer processing system 1 further has a controller 6 which performs controls of the wafer processing system 1 including the control of a later-explained transfer apparatus 20.

The cassette station 2 is divided, for example, into a cassette transfer-in/out section 10 and a wafer transfer section 11. The cassette transfer-in/out section 10 is provided, for example, at an end on a Y-direction negative direction (left direction in FIG. 1) side in the wafer processing system 1. In the cassette transfer-in/out section 10, a cassette stage 12 is provided. On the cassette stage 12, a plurality of, for example, four stage plates 13 are provided. The stage plates 13 are provided side by side in a line in an X-direction (up-down direction in FIG. 1) being a horizontal direction. On the stage plates 13, cassettes C can be mounted when the cassettes C are transferred in/out from/to the outside of the wafer processing system 1.

In the wafer transfer section 11, the transfer apparatus 20 as the substrate transfer apparatus is provided which transfers the wafer W. The transfer apparatus 20 is provided with a transfer path 21 extending in the X-direction and a transfer unit 22 movable on the transfer path 21. The transfer unit 22 has a later-explained fork movable in a Y-direction. The transfer unit 22 is movable also in an up-down direction and around a vertical axis (in a θ-direction), and can transfer the wafer W between the cassette C on each stage plate 13 and a later-explained delivery apparatus in a third block G3 in the processing station 3. The details of the transfer unit 22 will be explained later.

In the processing station 3, a plurality of, for example, four such as first to fourth blocks G1, G2, G3, G4 each including various apparatuses are provided. For example, the first block G1 is provided on the front side (X-direction negative direction side in FIG. 1) in the processing station 3, and the second block G2 is provided on the rear side (X-direction positive direction side in FIG. 1) in the processing station 3. Further, the third block G3 is provided on the cassette station 2 side (Y-direction negative direction side in FIG. 1) in the processing station 3, and the fourth block G4 is provided on the interface station 5 side (Y-direction positive direction side in FIG. 1) in the processing station 3.

In the first block G1, a plurality of solution treatment apparatuses, for example, developing treatment apparatuses 30 each of which performs a developing treatment on the wafer W, and resist coating apparatuses 31 each of which applies the resist solution to the wafer W to form a resist film are arranged in this order from the bottom as illustrated in FIG. 2.

For example, three each of developing treatment apparatuses 30 and resist coating apparatuses 31 are arranged side by side in the horizontal direction. Note that the numbers and the arrangement of the developing treatment apparatuses 30 and the resist coating apparatuses 31 can be arbitrarily selected.

In each of the developing treatment apparatuses 30 and the resist coating apparatuses 31, for example, a predetermined treatment solution is applied onto the wafer W, for example, by a spin coating method. In the spin coating, the treatment solution is discharged onto the wafer W, for example, from a discharge nozzle and the wafer W is rotated to diffuse the treatment solution over the surface of the wafer W.

For example, in the second block G2, thermal processing apparatuses 40 each of which performs thermal processing such as heating and cooling on the wafer W and edge exposure apparatuses 41 each of which exposes the outer peripheral portion of the wafer W are provided one above the other in the up-down direction and side by side in the horizontal direction as illustrated in FIG. 3. The numbers and the arrangement of the thermal processing apparatuses 40 and the edge exposure apparatuses 41 can also be arbitrarily selected.

In the third block G3, a plurality of delivery apparatuses 50 are provided. Further, in the fourth block G4, a plurality of delivery apparatuses 60 are provided.

As illustrated in FIG. 1, in a region surrounded by the first block G1 to the fourth block G4, a wafer transfer region D is formed. In the wafer transfer region D, for example, a transfer apparatus 70 is arranged.

The transfer apparatus 70 has a transfer arm 70a movable, for example, in the Y-direction, the front-rear direction, the θ-direction, and the up-down direction. The transfer apparatus 70 can move the transfer arm 70a holding the wafer W in the wafer transfer region D and transfer the wafer W to a predetermined apparatus in the first block G1, the second block G2, the third block G3, and the fourth block G4 therearound. A plurality of the transfer apparatuses 70 are arranged one above the other, for example, as illustrated in FIG. 3, and can transfer the wafers W, for example, to predetermined apparatuses at approximately the same heights in the blocks G1 to G4.

Further, in the wafer transfer region D, a shuttle transfer apparatus 71 is provided which linearly transfers the wafer W between the third block G3 and the fourth block G4.

The shuttle transfer apparatus 71 linearly moves the wafer W supported thereon in the Y-direction and can transfer the wafer W between the delivery apparatus 50 in the third block G3 and the delivery apparatus 60 in the fourth block G4 at approximately the same heights.

As illustrated in FIG. 1, a transfer apparatus 72 is provided on the X-direction positive direction side in the third block G3. The transfer apparatus 72 has a transfer arm 72a that is movable, for example, in the front-rear direction, the θ-direction, and the up-down direction. The transfer apparatus 72 can move up and down the transfer arm 72a holding the wafer W to transfer the wafer W to each of the delivery apparatuses 50 in the third block G3.

In the interface station 5, a transfer apparatus 73 and a delivery apparatus 74 are provided. The transfer apparatus 73 has a transfer arm 73a that is movable, for example, in the Y-direction, the θ-direction, and the up-down direction. The transfer apparatus 73 can transfer the wafer W to/from each of the delivery apparatuses 60 in the fourth block G4, the delivery apparatus 74, and the exposure apparatus 4 while supporting the wafer W by the transfer arm 73a.

The above controller 6 is, for example, a computer including a processor such as a CPU and a memory, and has a program storage (not illustrated). The program storage stores programs for controlling the later-explained wafer processing by controlling the operations of the drive systems of the above various processing apparatuses and transfer apparatuses. Further, the program storage also stores a program for controlling later-explained state determination processing. Note that the above programs may be the ones recorded in a computer-readable storage medium H and installed from the storage medium H into the controller 6. The storage medium H may be the transitory one or may be the non-transitory one. Some or all of the programs may be implemented by dedicated hardware (circuit board).

<Wafer Processing>

Next, the wafer processing using the wafer processing system 1 will be explained.

In the wafer processing using the wafer processing system 1, first, the wafer W is taken out of the cassette C on the cassette stage 12 by the transfer unit 22 and transferred to the delivery apparatus 50 in the processing station 3.

Next, the wafer W is transferred by the transfer apparatus 70 to the thermal processing apparatus 40 in the second block G2 and subjected to temperature regulation processing. Thereafter, the wafer W is transferred to the resist coating apparatus 31 in the first block G1, in which a resist film is formed on the wafer W. The wafer W is then transferred to the thermal processing apparatus 40 and subjected to pre-bake processing (PAB: Pre-Applied Bake). Note that the same thermal processing is performed in the pre-bake processing, and PEB processing and post-bake processing at subsequent stages. However, the thermal processing apparatuses 40 used for the thermal processing are different from one another.

The wafer W is then transferred to the edge exposure apparatus 41 and subjected to edge exposure processing.

The wafer W is then transferred to the exposure apparatus 4 and subjected to exposure processing in a predetermined pattern.

The wafer W is then transferred to the thermal processing apparatus 40 and subjected to the PEB processing. The wafer W is then transferred, for example, to the developing treatment apparatus 30 and subjected to a developing treatment. After the finish of the developing treatment, the wafer W is transferred to the thermal processing apparatus 40 and subjected to the post-bake processing. Then, the wafer W is transferred by the transfer unit 22 or the like to the cassette C on the cassette stage 12, with which a series of photolithography processes is completed.

<Transfer Unit 22>

Figure 4:
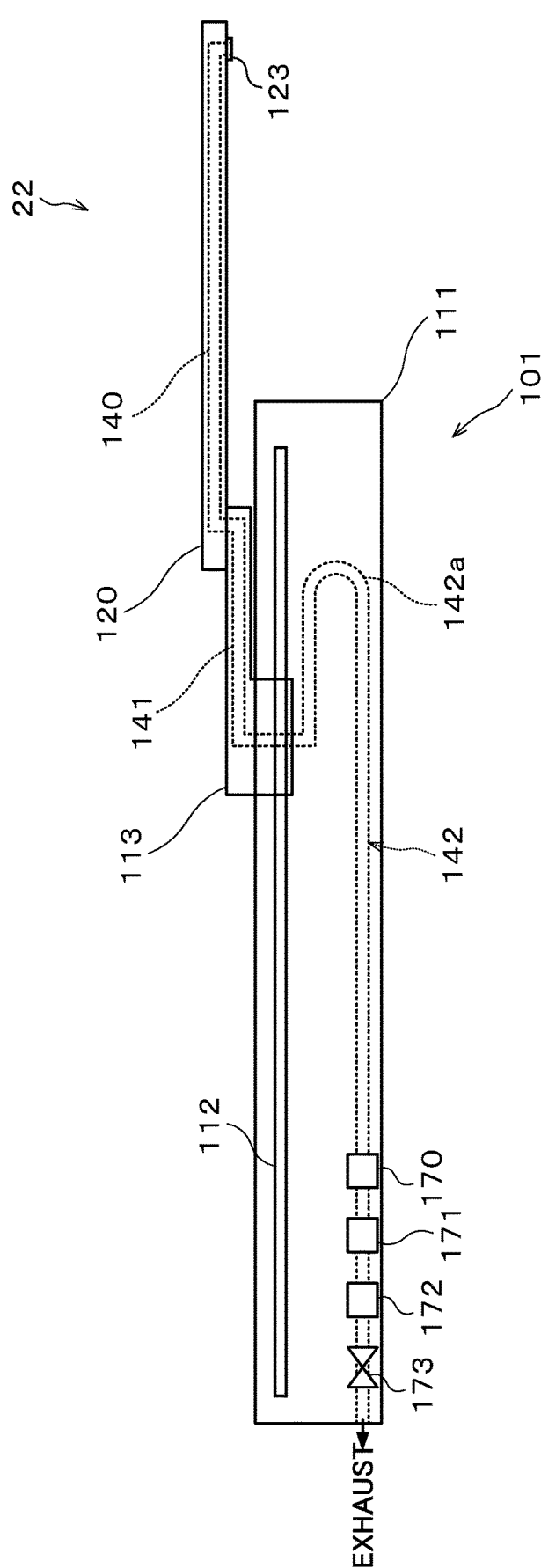
FIG. 4 is a side view illustrating the outline of a configuration of a transfer unit.
Figure 5:
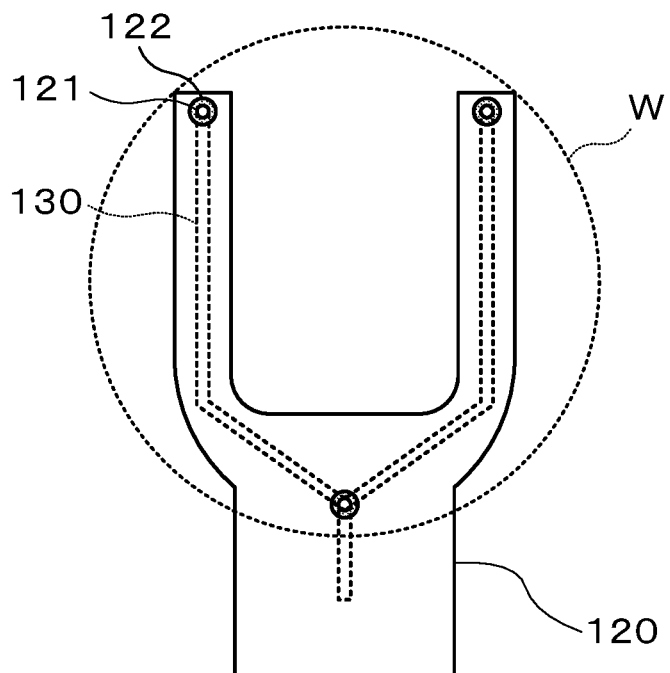
FIG. 5 is a top view illustrating the outline of a configuration of a fork.
Figure 6:
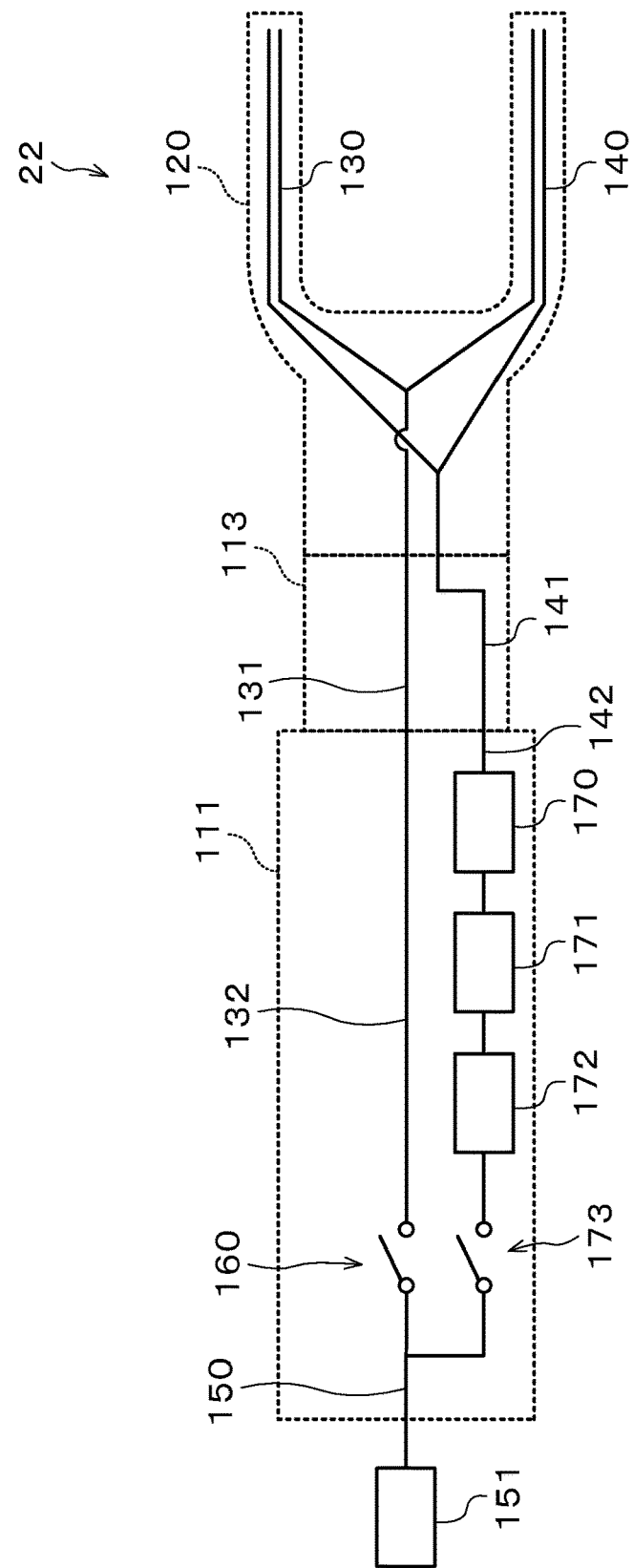
FIG. 6 is a piping system diagram of the transfer unit.
Figure 7:
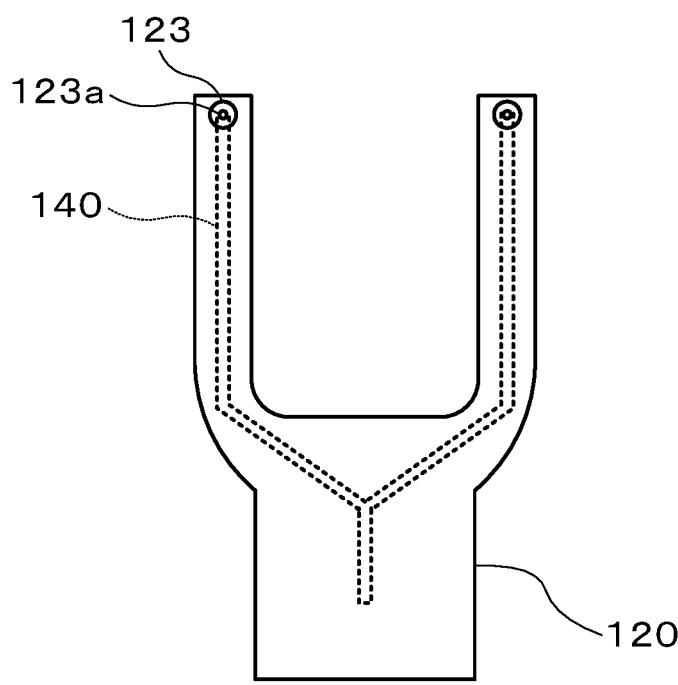
FIG. 7 is a bottom view illustrating the outline of the configuration of the fork.
Figure 8:
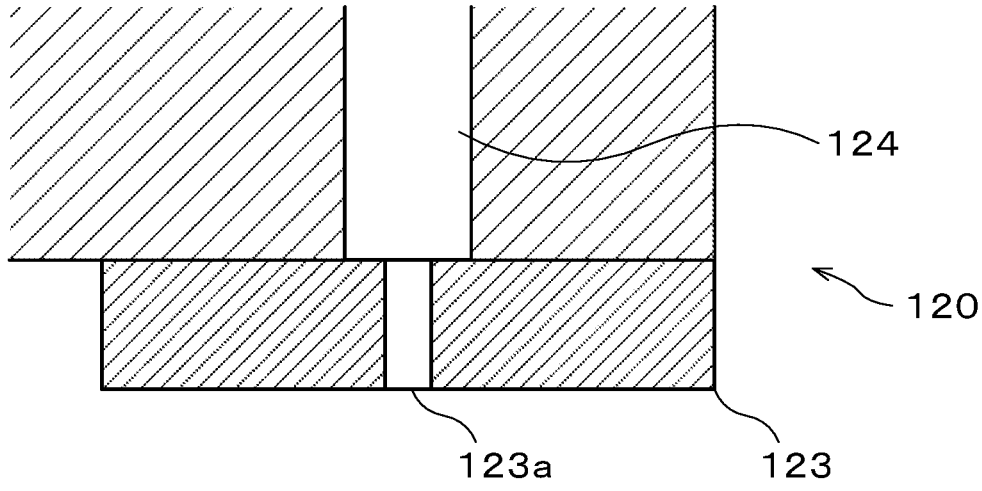
FIG. 8 is a cross-sectional view illustrating the outline of a configuration of a nozzle

Next, the configuration of the above transfer unit 22 will be explained using FIG. 4 to FIG. 8. FIG. 4 is a side view illustrating the outline of the configuration of the transfer unit 22, and FIG. 5 is a top view illustrating the outline of the configuration of the later-explained fork. FIG. 6 is a piping system diagram of the transfer unit 22. FIG. 7 is a bottom view illustrating the outline of the configuration of the fork. FIG. 8 is a cross-sectional view illustrating the outline of the configuration of a later-explained nozzle.

The transfer unit 22 has a base 101 as illustrated in FIG. 4.

The base 101 is intended to support the later-explained fork movable in the horizontal direction. The base 101 is configured to be able to move along the transfer path 21 in FIG. 1 and able to rise and lower by a driving force generated by a drive source (not illustrated) having, for example, a motor. Further, the base 101 has a square cylindrical housing 111 having a hollow inside. On both side surfaces of the housing 111, horizontally extending guide rails 112 are formed. To the guide rails 112, an attachment member 113 is installed.

The attachment member 113 is provided with a fork 120 as the substrate holder which holds the wafer W. The attachment member 113 is slidable along the guide rails 112 by the driving force generated by a drive source (not illustrated) having, for example, a motor. This configuration makes the fork 120 movable in the horizontal direction. The fork 120 is concretely configured such that the whole fork 120 can move to an initial position located outside the cassette C at the time of carrying the wafer into/out of the cassette C, and move to a delivery position which is a position when delivering the wafer W to/from the cassette C at the time of carrying in/out and is a position in the cassette C.

The tip end side of the fork 120 has a bifurcate shape having a breadth smaller than the diameter of the wafer W as illustrated in FIG. 5.

The upper surface of the fork 120 is provided with a plurality of (three in the example of the drawing) adsorption ports 121 and adsorption pads 122 provided around the respective adsorption ports 121.

Inside the fork 120, a first internal flow path 130 is formed whose tips are connected to the adsorption ports 121. The first internal flow path 130 is branched, on its tip end side, into three portions, and the tips of the branched portions are connected to the adsorption ports 121, respectively.

Further, as illustrated in FIG. 6, a first relay flow path 131 whose tip end is connected to the base end of the first internal flow path 130 is formed inside the attachment member 113.

Further, a first pipe 132 whose tip end is connected to the base end of the first relay flow path 131 is provided inside the housing 111 of the base 101. The base end of the first pipe 132 joins the base end of a later-explained second pipe which communicates with a later-explained nozzle, and communicates with an exhaust mechanism 151 which exhausts gas at a predetermined exhaust pressure via a confluent pipe 150. The above configuration makes it possible for the fork 120 to adsorb and hold the wafer W via the adsorption ports 121. Note that a part of the confluent pipe 150 may be located inside the housing 111 of the base 101.

The first internal flow path 130, the first relay flow path 131, and the first pipe 132 constitute an adsorption flow path which is connected to the adsorption ports 121 and allows gas to flow therethrough at the adsorption time. Note that the illustration of the first internal flow path 130, the first relay flow path 131, and the first pipe 132 is omitted in FIG. 4 and FIG. 7.

Further, the first pipe 132 is provided with an opening/closing valve 160 which switches between open and shut of the first pipe 132. The opening/closing valve 160 switches between open and shut of the first pipe 132 and thereby switches between ON and OFF of suction via the adsorption ports 121, namely, of adsorption. The opening/closing valve 160 is controlled by the controller 6.

Further, the surface of the fork 120, more specifically, the lower surface of the fork 120 is provided with a nozzle 123 as illustrated in FIG. 7. There are a plurality of (two in this example) nozzles 123, each of which is provided in each of regions different from each other. Concretely, each of the nozzles 123 is provided on the lower surface of each of the branched portions on the tip end sides of the fork 120 for instance.

The nozzle 123 is provided so as to extend downward from the lower surface of the fork 120 as illustrated in FIG. 8. More specifically, the nozzle 123 is provided to extend toward the wafer W being an interferer when the wafer being the interferer is located below the fork 120. The nozzle 123 has a passage hole 123a penetrating from the tip end to the base end (namely, vertically penetrating). The diameter of the passage hole 123a is, for example, 0.5 mm to 3 mm. Note that the fixation of the nozzle 123 to the fork 120 is performed, for example, by bonding fixation.

The nozzle 123 is formed, for example, in a circular cylindrical shape. The nozzle 123 has a diameter of, for example, 5 mm to 10 mm and a height of, for example, 0.5 to 3 mm. As the material of the nozzle 123, for example, the same material as that of the fork 120 is used.

Further, inside the fork 120, a second internal flow path 140 whose tip end is connected to the nozzle 123 is formed as illustrated in FIG. 7. The tip end of the second internal flow path 140 is concretely connected to the passage hole 123a of the nozzle 123. The second internal flow path 140 is branched, on its tip end side, into two portions, and the tips of the branched portions are connected to the passage holes 123a, respectively. In this example, the first internal flow path 130 and the second internal flow path 140 are individually provided. Note that the illustration of the second internal flow path 140 is omitted in FIG. 5.

Further, as illustrated in FIG. 4 and FIG. 6, a second relay flow path 141 whose tip end is connected to the base end of the second internal flow path 140 is formed inside the attachment member 113.

Further, a second pipe 142 whose tip end is connected to the base end of the second relay flow path 141 is provided inside the housing 111 of the base 101. The base end of the second pipe 142 joins the base end of the first pipe 132 which communicates with the adsorption ports 121, and communicates with the exhaust mechanism 151 common to the first pipe 132 via the confluent pipe 150. The above configuration makes it possible to suck the gas around the tips of the nozzle 123 through the passage holes 123a into the nozzle 123, and to allow the gas from the passage holes 123a to flow through the second internal flow path 140, the second relay flow path 141, and the second pipe 142 in this order and to discharge the gas via the exhaust mechanism 151. The second internal flow path 140, the second relay flow path 141, and the second pipe 142 constitute a nozzle flow path which is connected to the nozzle 123 and allows the gas to flow therethrough.

Besides, the second pipe 142 has a portion 142a deformable accompanying the movement of the fork 120.

Further, the second pipe 142 is provided with a flow rate sensor 170, a pressure sensor 171, a speed controller 172, and an opening/closing valve 173 in this order, for example, from the nozzle 123 side.

The flow rate sensor 170 measures the flow rate of the gas flowing through the second pipe 142 via the nozzle 123, namely, the flow rate of the gas flowing through the nozzle flow path (hereinafter, referred to as "intake flow rate"). The measurement result by the flow rate sensor 170 is output to the controller 6.

The pressure sensor 171 measures the pressure of the gas flowing through the second pipe 142 via the nozzle 123, namely, the pressure of the gas flowing through the nozzle flow path (hereinafter, referred to as "intake pressure"). The measurement result by the pressure sensor 171 is output to the controller 6.

The speed controller 172 adjusts the flow speed of the gas flowing through the second pipe 142 via the nozzle 123 by the exhaust of gas by the exhaust mechanism 151 to adjust the intake pressure. The speed controller 172 is controlled by the controller 6.

The opening/closing valve 173 switches between open and shut of the second pipe 142 to switch between ON and OFF of intake of the gas via the nozzle 123. The opening/closing valve 173 is controlled by the controller 6.

The flow rate sensor 170, the pressure sensor 171, the speed controller 172, and the opening/closing valve 173 are provided, for example, at a portion opposite to the second internal flow path 140 across the deformable portion 142a of the second pipe 142. This also applies to the opening/closing valve 160 though its illustration is omitted.

Further, in this example, one each of the flow rate sensor 170, the pressure sensor 171, the speed controller 172, and the opening/closing valve 173 are used in common to the two passage holes 123a.

The exhaust mechanism 151 provided for the transfer unit 22 is a suction mechanism which exhausts gas, namely, sucks gas, and has, for example, an exhaust pump. The exhaust mechanism 151 is connected to the first pipe 132 and the second pipe 142 via the confluent pipe 150 which the first pipe 132 and the second pipe 142 join. In other words, the first pipe 132 and the second pipe 142 are connected to the common exhaust mechanism 151, and in further other words, the adsorption flow path including the first pipe 132 and the nozzle flow path including the second pipe 142 are connected to the common exhaust mechanism 151.

Note that the attachment member 113 and the fork 120 are formed using, for example, aluminum. Besides, for example, a plate material made of aluminum forming the outer shape of the attachment member 113 and the fork 120 is cut to form a groove, and an opening portion side of the groove is filled up to form the first relay flow path 131, the second relay flow path 141, the first internal flow path 130, and the second internal flow path 140. Note that the fork 120 may be formed using a ceramic material.

<State Determination>

Subsequently, the determination on the state of the distance between the fork 120 and the interferer in this embodiment will be explained.

The interferer is, for example, the wafer W located below the fork 120 in the cassette C into which the fork 120 is inserted.

In this embodiment, the controller 6 makes the determination on the state of the distance between the fork 120 and the wafer W below it, more specifically, the determination on the state of the distance between the lower surface of the fork 120 and the upper surface of the wafer W based on the measurement result by the flow rate sensor 170 and the measurement result by the pressure sensor 171. The above determination is, for example, a determination of whether the fork 120 has come into contact with the wafer W below it. Note that the above determination may be a determination of whether the fork 120 has come close to the wafer W below it. In the following example, the determination of whether the fork 120 has come into contact with the wafer W below it will be made.

Among the measurement result by the flow rate sensor 170 of the measurement result by the flow rate sensor 170 and the measurement result by the pressure sensor 171 which are used for the determination of whether the contact has been made, the reason why to use the measurement result by the flow rate sensor 170 is explained first.

Figure 9:
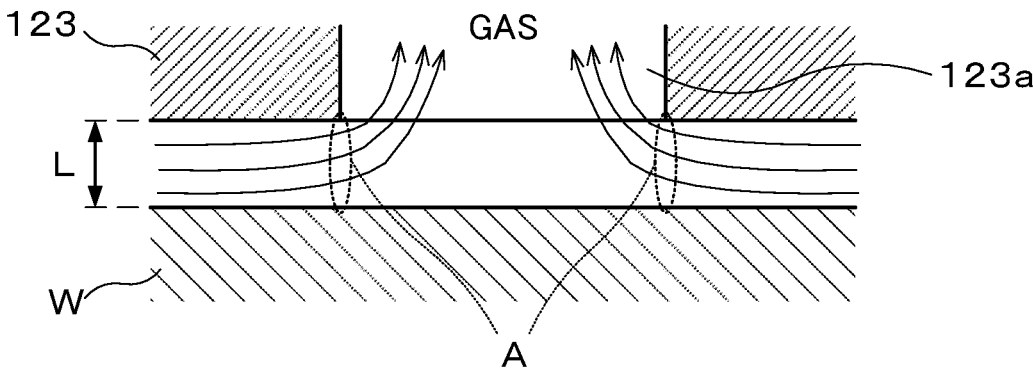
FIG. 9 is a view for explaining the reason why to make a determination of whether the fork and a wafer below it are in contact with each other based on a measurement result by a flow rate sensor.

As illustrated in FIG. 9, a distance L between the flat tip end surface of the nozzle 123 and the upper surface of the wafer W is proportional to an effective cross-sectional area A with respect to the gas flowing toward the passage hole 123a. Further, in the case of sucking the gas from the passage hole 123a at a constant exhaust pressure, the effective cross-sectional area A and the flow rate of the gas flowing toward the passage holes 123a are almost proportional when the nozzle 123 and the wafer W close to each other. Accordingly, when the distance between the nozzle 123 and the wafer W (concretely, the distance between the flat tip end surface of the nozzle 123 and the upper surface of the wafer W) L is short, the flow rate of the gas flowing toward the passage hole 123a is low, and as a result, the flow rate measured by the flow rate sensor 170 provided at the second pipe 142, namely, the intake flow rate is low. Alternatively, when the distance L is long, the flow rate of the gas flowing toward the passage hole 123a is high, and as a result, the intake flow rate measured by the flow rate sensor 170 is also high. In short, the intake flow rate measured by the flow rate sensor 170 changes according to the distance L. This is the reason why to use the measurement result of the flow rate sensor 170.

Figure 10:
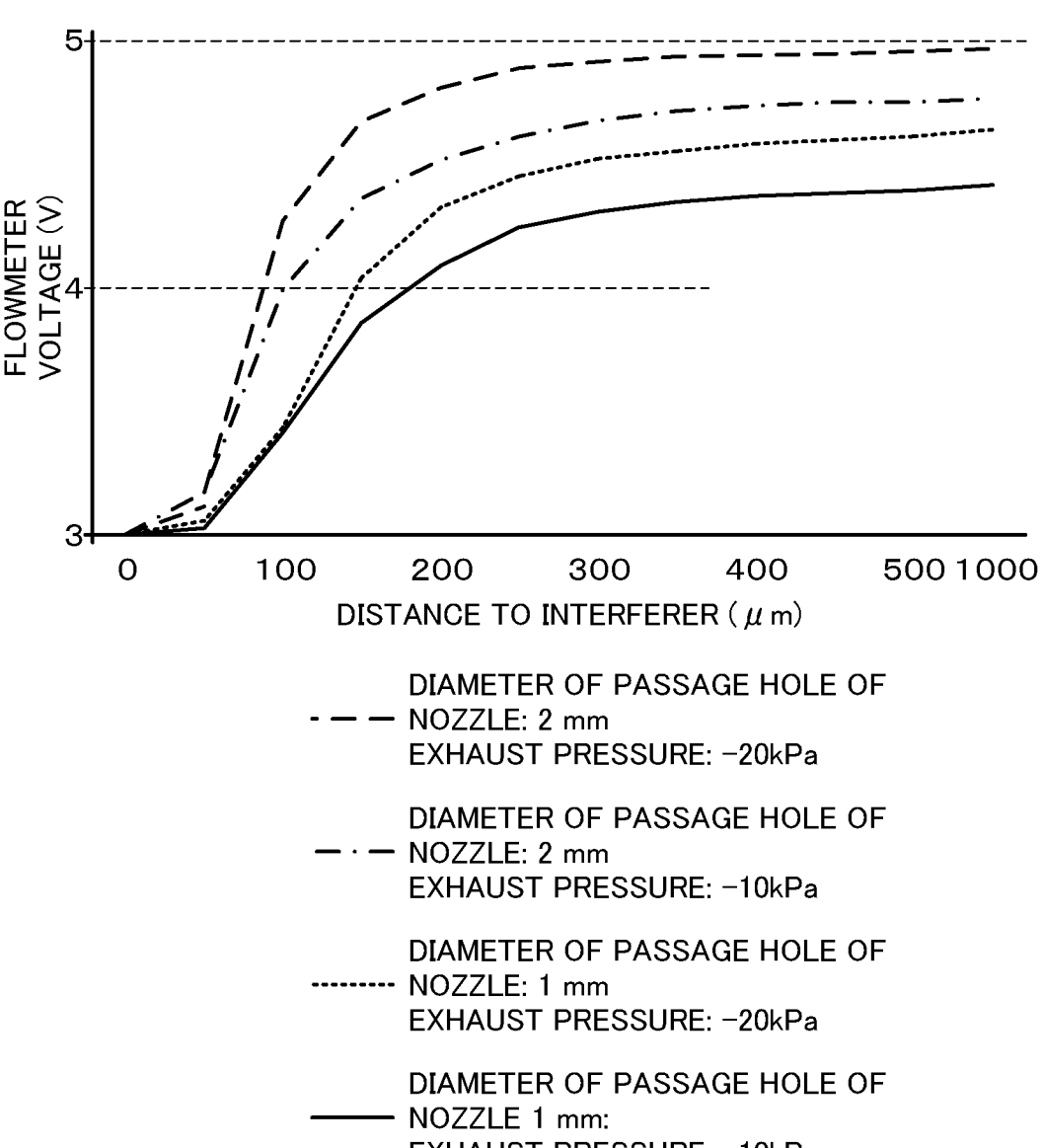
FIG. 10 is a chart illustrating the relation between a distance from a simulation fork to which a simulation nozzle is attached, to an interferer, and an actual measurement result by the flow rate sensor.

FIG. 10 is a chart illustrating the relation between the distance from a fork (hereinafter, referred to as "simulation fork") having the same shape as that of the fork 120 to which a nozzle (hereinafter, referred to as "simulation nozzle")

having the same shape as that of the nozzle 123 having the passage hole 123a is attached, to the interferer, and an actual measurement result by the flow rate sensor.

What is illustrated in FIG. 10 is the result obtained by providing one simulation nozzle and measuring by the flow rate sensor provided at the pipe which connects the simulation nozzle and the exhaust mechanism when the simulation nozzle is made to suck gas at a constant exhaust pressure via the passage hole formed at the simulation nozzle. The horizontal axis indicates the distance from the simulation fork to the interferer, and the vertical axis indicates output voltage of the flow rate sensor representing the measurement result of the intake flow rate.

As is clear from FIG. 10, when the distance from the simulation nozzle to the interferer is 200 μm or less, the output voltage of the flow rate sensor, namely, the intake flow rate measured by the flow rate sensor decreases as the distance becomes shorter irrespective of the diameter of the passage hole and the exhaust pressure of the simulation nozzle. The result shows that the measurement result by the flow rate sensor 170 can be used for the determination of whether the fork 120 has come into contact with the wafer W below it.

Next, the reason why to use not only the measurement result by the flow rate sensor 170 but also the measurement result by the pressure sensor 171 for the determination of whether the contact has been made is explained.

The intake flow rate measured by the flow rate sensor 170 varies according to the distance L between the nozzle 123 and the wafer W as explained above, and varies according to the intake pressure measured by the pressure sensor 171 even if the distance L is constant. Further, even if the distance L is constant, the intake pressure does not become constant in the configuration sharing the exhaust mechanism 151 in some cases. For example, when delivering the wafer W between the cassette C and the fork 120, the determination of whether the fork 120 has come into contact with the wafer W below it in the cassette C is made in some cases. In this case, for example, when the opening/closing valve 160 provided at the first pipe 132 included in the above adsorption flow path is opened for turning the adsorption ON in order to deliver the wafer W, the pressure of the gas flowing through the above adsorption flow path varies to vary the exhaust pressure acting on the above nozzle flow path from the exhaust mechanism 151, so that the intake pressure measured by the pressure sensor 171 varies.

Therefore, there may be an erroneous determination if whether the fork 120 has come into contact with the wafer W below it is simply determined by, for example, based on whether the intake flow rate measured by the flow rate sensor 170 has become less than a threshold value.

Further, the research by the present inventors shows that even if the exhaust pressure acting on the above nozzle flow path from the exhaust mechanism 151 is constant, not only the intake flow rate measured by the flow rate sensor 170 but also the intake pressure measured by the pressure sensor 171 vary according to the distance L between the nozzle 123 and the wafer W. It is also shown that when the distance L between the nozzle 123 and the wafer W is decreased in the case where the exhaust pressure acting on the above nozzle flow path from the exhaust mechanism 151 is constant, the intake pressure decreases and the intake flow rate also decreases, whereas when the exhaust pressure is varied and the intake pressure is increased in the case where the distance L is constant, the intake flow rate increases.

Hence, in this embodiment, both the measurement result of the intake flow rate by the flow rate sensor 170 and the measurement result of the intake pressure by the pressure sensor 171 are used for the determination of whether the fork 120 has come into contact with the wafer W below it.

In this embodiment, concretely, the controller 6 makes the above determination from the relation between the measurement result of the intake flow rate by the flow rate sensor 170 and the measurement result of the intake pressure by the pressure sensor 171 at the same time point during a target period of the determination. A more concrete example of the determination method will be explained using FIG. 11.

Figure 11:
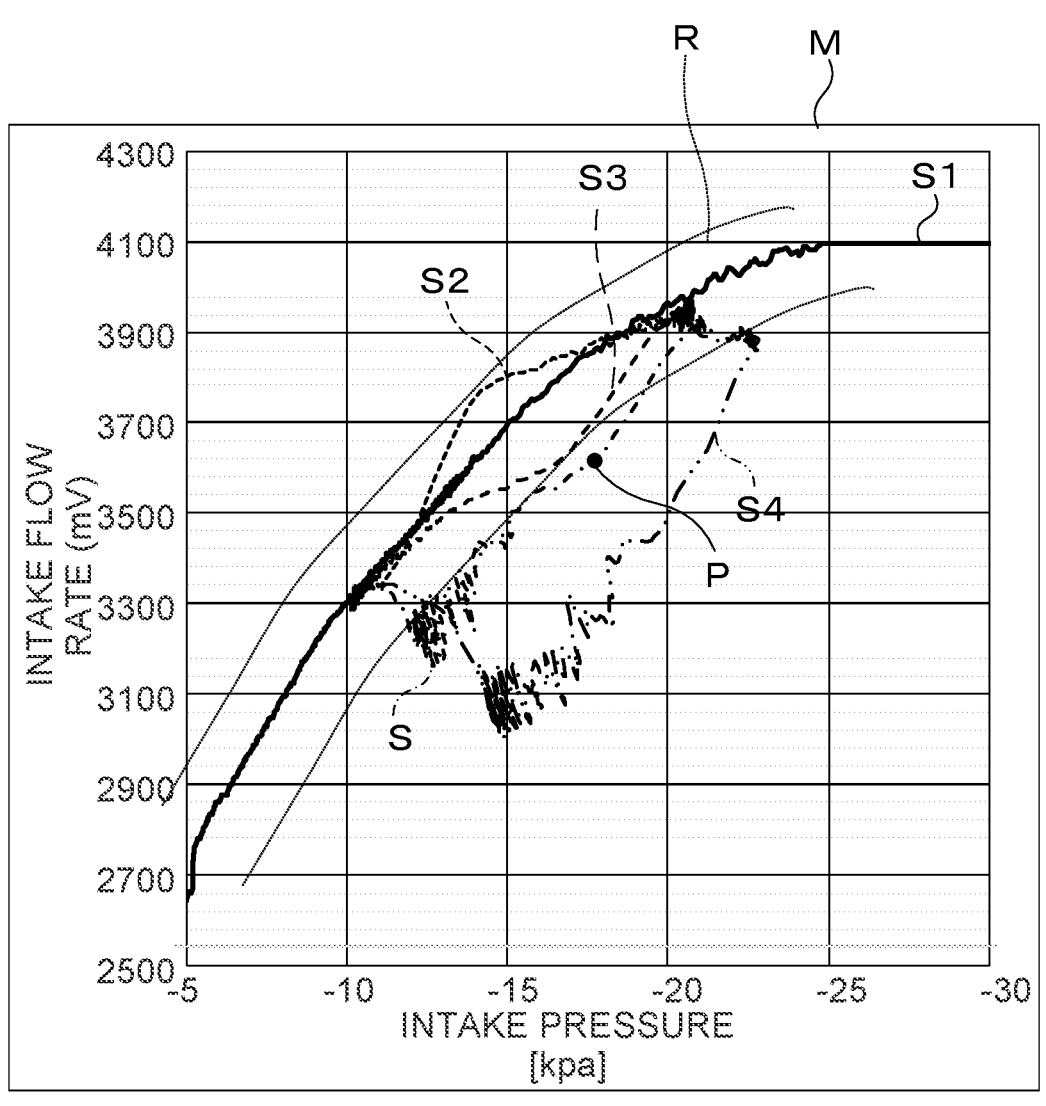
FIG. 11 is a chart for explaining an example of conditions used for the determination of whether the fork has come into contact with the wafer below it.

FIG. 11 is a chart for explaining an example of conditions used for the determination of whether the fork 120 has come into contact with the wafer W below it.

FIG. 11 illustrates a two-dimensional plane M using the intake flow rate and the intake pressure as axes, more specifically, a two-dimensional plane M using one of the intake flow rate (the output voltage from the pressure sensor 171 corresponding to thereto) and the intake pressure (the intake pressure in the example of the chart) as the horizontal axis and using the other (the intake flow rate in the chart) as the vertical axis.

Each of Point sets S1 to S4 indicates the measurement result of the intake flow rate and the measurement result of the intake pressure by the pressure sensor 171 at each time point during a predetermined period obtained by the actual experiment by the present inventors.

Further, each of the point sets S1 to S3 indicates the one obtained in a state where the fork 120 was fixed, namely, the one obtained when there was no contact between the fork 120 and the interferer.

The point set S1 is the one obtained by controlling the speed controller 172 to change the intake pressure in a state where the exhaust pressure acting on the above nozzle flow path from the exhaust mechanism 151 was constant (namely, without turning ON/OFF the adsorption) during the above predetermined period.

The point set S2 is the one obtained by turning ON the adsorption from a state where the adsorption was OFF, by the opening/closing valve 160 during the above predetermined period.

The point set S3 is the one obtained by turning OFF the adsorption from a state where the adsorption was ON, by the opening/closing valve 160 during the above predetermined period.

The point set S4 is the one obtained when the fork 120 adsorbing and holding the wafer W was inserted into the cassette C, the adsorption was turned OFF from ON by the opening/closing valve 160, the wafer W was delivered from the fork 120 to the cassette C, and the fork 120 was pulled out of the cassette C during the above predetermined period. Further, the point set S4 is the one obtained when the fork 120 came into contact with the wafer W below it during the above predetermined period.

Here, a reference region R is set in the two-dimensional plane using the point set S1 as a reference.

The point sets S2, S3 are, plainly speaking, the ones when ON/OFF of the adsorption was switched by the opening/closing valve 160 but the contact between the fork 120 and the interferer did not occur. All of the point sets S2, S3 fall within the reference region R.

In contrast to the above, the point set S4 is, plainly speaking, the one obtained when ON/OFF of the adsorption was switched by the opening/closing valve 160 and the contact between the fork 120 and the interferer occurred. The point set S4 does not partially fall within the reference region R.

Based on the result in FIG. 11, the controller 6 makes the determination of whether the fork 120 has come into contact with the wafer W below it as follows in this embodiment. More specifically, the controller 6 makes the determination based on whether all of the point sets S indicating the relation between the measurement result of the intake flow rate by the flow rate sensor 170 and the measurement result of the intake pressure by the pressure sensor 171 at each time point during the determination target period fall within the predetermined reference region R on the two-dimensional plane. If not falling, the controller 6 determines that they have come into contact.

More specifically, the controller 6 makes a determination of whether the point indicating the relation between the measurement result of the intake flow rate and the measurement result of the intake pressure at the time point falls within the predetermined reference region R on the two-dimensional plane M at each time point included in the determination target period, and makes the determination of whether they have come into contact from the determination result. If a position P indicating the relation between the measurement result of the intake flow rate and the measurement result of the intake pressure at any time point T included in the determination target period does not fall within the predetermined reference region R, the controller 6 determines that they have come into contact.

The reference region R is decided, for example, by acquiring in advance the same point set under the same conditions as those when the above point set S1 is acquired and using the acquisition result as a reference. For example, a region where the distance from the point set acquired in advance is a predetermined value or less is set as the reference region R.

Further, the reference region R may be decided, for example, by acquiring in advance the same point sets under the same three conditions as those when the above point sets S1 to S3 are acquired and using the acquisition results as a reference.

The method of determining whether the fork 120 has come into contact with the wafer W below it by using both of the measurement result of the intake flow rate by the flow rate sensor 170 and the measurement result of the intake pressure by the pressure sensor 171 is not limited to the above.

<State Determination Processing>

Next, the state determination processing in the wafer processing system 1 will be explained. This determination processing is performed, for example, at the time of maintenance and starting the apparatus, at the mass production by the wafer processing system 1, namely, during the operation of the apparatus, and so on.

(Determination Data Acquisition)

First, in a state where the adsorption is turned ON by the opening/closing valve 160 and the intake is turned ON by the opening/closing valve 173, the fork 120 adsorbing the wafer W is moved from the above initial position, inserted into the cassette C, and moved to the above delivery position. Then, the adsorption is turned OFF by the opening/closing valve 160, the fork 120 is lowered, and the wafer W is delivered from the fork 120 to the wafer supporter (not illustrated) in the cassette C. Then, the fork 120 is moved from the delivery position to the initial position.

Then, during the movement of the fork 120 as above, the flow rate sensor 170 continues to measure the intake flow rate and the pressure sensor 171 continues to measure the intake pressure, and the controller 6 continues to acquire the measurement results.

(Determination)

Then, the controller 6 determines whether the fork 120 has come into contact with the wafer W below it, during the above movement of the fork 120, based on the measurement result of the intake flow rate by the flow rate sensor 170 and the measurement result of the intake pressure by the pressure sensor 171. The controller 6 determines whether a position Pi (i=1 to n) indicating the relation between the measurement result of the intake flow rate and the measurement result of the intake pressure at a time point Ti (i=1 to n) falls within the predetermined reference region R on the two-dimensional plane M for each of time points T1 to Tn included in the determination target period, and determines whether they have come into contact from the determination result. If the position Pi (i=1 to n) indicating the relation between the measurement result of the intake flow rate and the measurement result of the intake pressure at any time point Ti (i=1 to n) does not fall within the predetermined reference region R, the controller 6 determines that they have come into contact.

Note that the controller 6 may make a determination of whether they have come into contact after all of the measurement results of the intake flow rate and the measurement result of the intake pressure until the completion of the movement of the fork 120, or may periodically make the above determination until the completion of the movement of the fork 120 such as every time acquisition of the measurement results. In the latter case, the controller 6 may stop the above determination after the determination that they have come into contact.

As in the above, the transfer apparatus 20 according to this embodiment includes the fork 120 and the nozzle 123 which is provided on the lower surface of the fork 120 and allows gas to pass therethrough. Further, the transfer apparatus 20 includes: the first internal flow path 130, the first relay flow path 131, and the first pipe 132 as the adsorption flow path which is connected to the adsorption ports 121 of the fork 120 and allows gas to flow therethrough at the adsorption time; and the second internal flow path 140, the second relay flow path 141, and the second pipe 142 as the nozzle flow path which is connected to the nozzle 123 and allows gas to flow therethrough. Further, in the transfer apparatus 20, the adsorption flow path and the nozzle flow path are connected to the common suction mechanism. The wafer processing system 1 further includes the pressure sensor 171 and the flow rate sensor 170 which measure the pressure and the flow rate of gas flowing through the nozzle flow path, respectively. Therefore, the controller 6 can make the determination on the state of the distance between the fork 120 and the wafer W located below the fork 120 in the cassette C, based on the pressure and the flow rate measured by the pressure sensor 171 and the flow rate sensor 170. The pressure and the flow rate of gas flowing through the nozzle flow path never largely change depending on the conductivity, the permittivity, or the like of the wafer W in the cassette C being the interferer. Therefore, according to this embodiment, the determination on the state of the distance between the wafer W and the fork 120 in the cassette C can be accurately made irrespective of the conductivity, the permittivity, and the like of the wafer W. Further, even if ON/OFF of the adsorption via the adsorption flow path is switched during the determination target period and the flow rate of the nozzle flow path varies as a result, the determination can be accurately made.

Further, even if the exhaust pressure of the exhaust mechanism 151 decreases during the determination target period and the flow rate of the nozzle flow path varies as a result, the determination can be accurately made.

Note that a conceivable method of determining whether the fork and the interferer are in contact other than the method according to this embodiment is the following one. Specifically, the conceivable method is a method of providing a vibration sensor at the fork so that the vibration sensor can detect the vibration when the fork and the interferer come into contact with each other, and determining whether the fork and the interferer are in contact based on the detection result by the vibration sensor. However, this method sometimes makes an erroneous determination when the fork is not in contact with the interferer but vibrates. In contrast to this, the determination made using the conditions described by using FIG. 11 does not lead to an erroneous determination even when the fork is not in contact with the interferer but vibrates.

Further, in this embodiment, the flow rate sensor 170 and the pressure sensor 171 are provided at a portion opposite to the second internal flow path 140 across the deformable portion 142a of the second pipe 142.

Therefore, it is easier to make routing or the like of a signal line around the flow rate sensor 170 and the pressure sensor 171 than in the case of providing the flow rate sensor 170 and the pressure sensor 171 on the second internal flow path 140 and the second relay flow path 141, and it is also easy to install the flow rate sensor 170 and the pressure sensor 171 themselves. Note that if the deformable portion 142a exists between the flow rate sensor 170 and the pressure sensor 171, and, the second internal flow path 140, in other words, if the bent portion exists on the upstream side of the flow rate sensor 170 and the pressure sensor 171, a variation in pressure loss is predicted at the bent portion and the flow rate varies due to the variation, and therefore it is considered that an S/N ratio in the measurement results of the flow rate sensor 170 and the pressure sensor 171 degrades. However, the earnest research by the present inventors reveals that a sufficient S/N ratio can be taken regardless of the flow rate caused by the variation in pressure loss, and therefore the above configuration is made.

<Another Example of the Transfer Unit>

Figure 12:
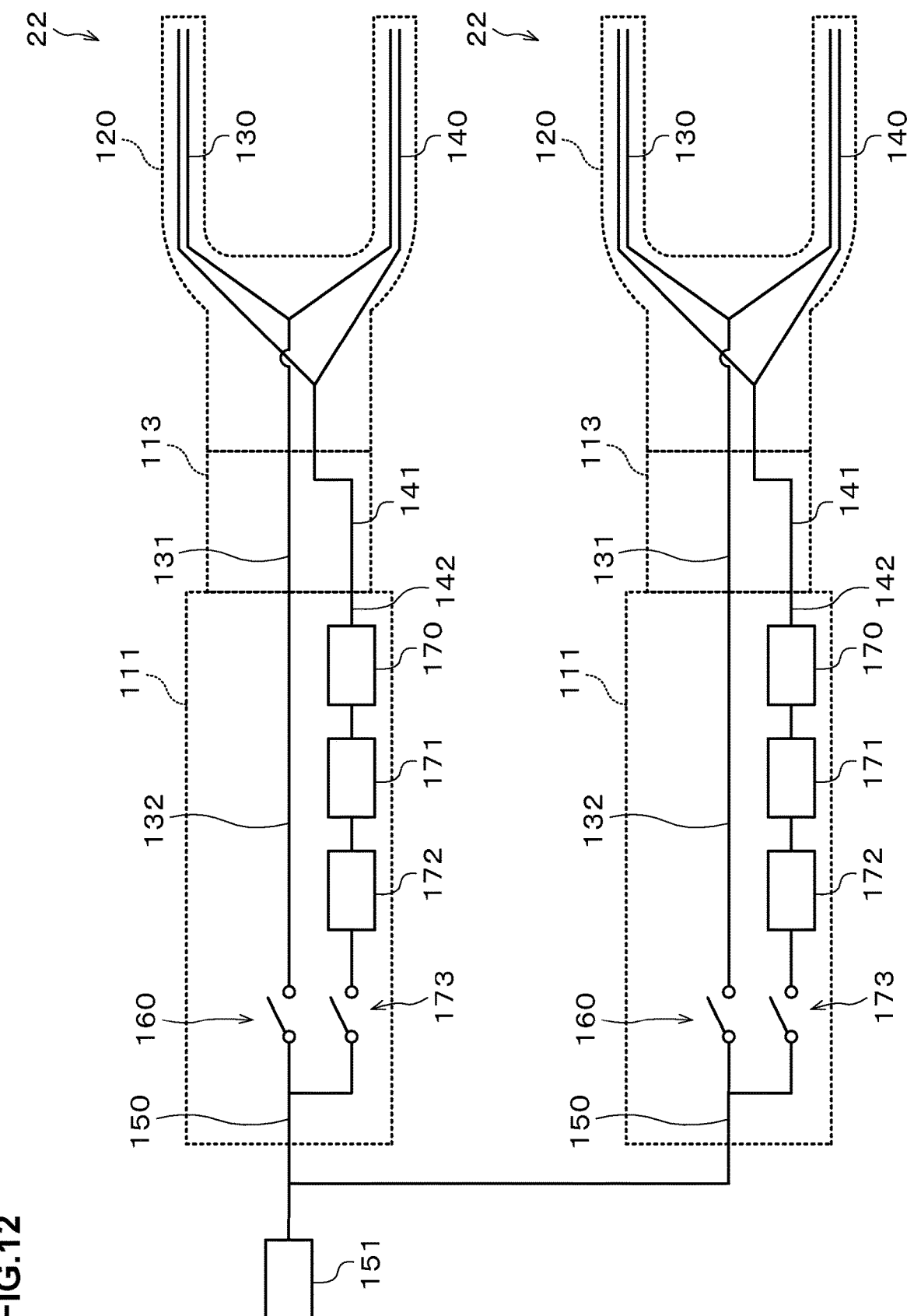
FIG. 12 is a diagram for explaining another example of the transfer unit.

FIG. 12 is a diagram for explaining another example of the transfer unit.

As illustrated in FIG. 12, a plurality of (two in the example of the drawing) transfer units 22 use the common exhaust mechanism 151 in some cases.

In this case, the intake pressure of the above nozzle flow path in one of the transfer units 22 sometimes varies due to the switching of ON/OFF of the adsorption by the opening/closing valve 160 in the other transfer unit 22. In short, the intake pressure of the above nozzle flow path in the one transfer unit 22 varies according to the pressure of the gas flowing through the above adsorption flow path in the other transfer unit 22.

Also in the above case, the determination on the state of the distance between the one transfer unit 22 and the interferer only needs to be made based on the measurement results of the flow rate and the pressure of the above nozzle flow path in the one transfer unit 22. Thus, even if ON/OFF of the adsorption is switched in the other transfer unit 22 and the flow rate of the nozzle flow path varies as a result during the determination target period, the determination can be accurately made.

<Another Example of the Fork>

Figure 13:
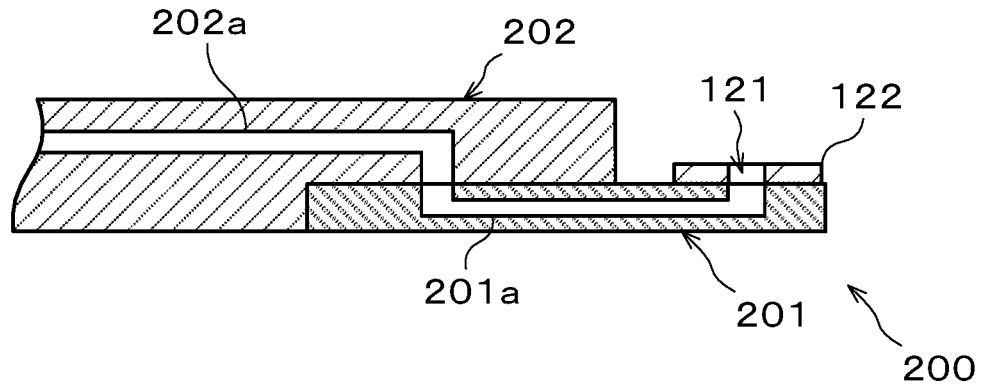
FIG. 13 is a view illustrating an example of an existing fork.
Figure 14:
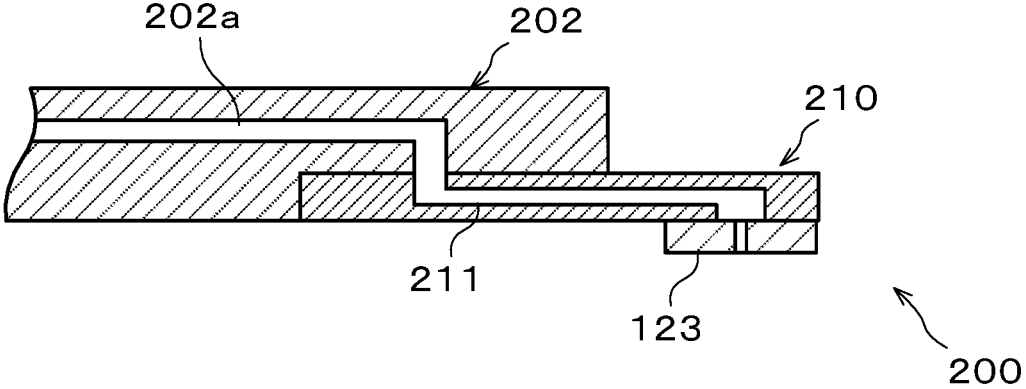
FIG. 14 is a view illustrating the appearance when a jig is attached, in place of an adsorption member, to the existing fork in FIG. 13.

Next, another example of the fork will be explained using FIG. 13 and FIG. 14. FIG. 13 illustrates an existing fork, and FIG. 14 is a view illustrating the appearance when a later-explained jig is attached, in place of a later-explained adsorption member, to the existing fork in FIG. 13.

As illustrated in FIG. 13, an existing fork 200 has an adsorption port 121 and an adsorption pad 122 as with the fork 120 illustrated in FIG. 4 and so on. However, the existing fork 200 does not have the nozzle 123 which is used for the state determination, unlike the fork 120.

The existing fork 200 concretely has an adsorption member 201 and a fork main body 202. The outer shape of the fork 200 is almost the same as that of the fork 120 illustrated in FIG. 5 and so on, and has a bifurcate shape on its tip end side.

The adsorption member 201 is detachably attached to the fork main body 202. Specifically, the adsorption member 201 is detachably attached to the lower surface of the fork main body 202. Note that the adsorption member 201 is fixed to the fork main body 202, for example, by screwing. The upper surface on the tip end side of the adsorption member 201 is not covered with the fork main body 202, and the adsorption port 121 opened upward is provided. At the upper surface on the tip end side of the adsorption member 201, the adsorption pad 122 is provided to cover the periphery of the opening of the adsorption port 121. Inside the adsorption member 201, a member-side internal flow path 201a is formed whose tip end is connected to the adsorption port 121 and which allows gas to flow therethrough.

The fork main body 202 is provided with a main body-side internal flow path 202a whose tip end is connected to the member-side internal flow path 201a and whose base side communicates with the exhaust mechanism 151 (see FIG. 6). The member-side internal flow path 201a and the main body-side internal flow path 202a constitute the first internal flow path 130 of the fork 120 illustrated in FIG. 4 and so on. In short, the member-side internal flow path 201a and the main body-side internal flow path 202a constitute the adsorption flow path.

In the case of making the determination on the state of the distance between the existing fork 200 and the wafer W located below it, the adsorption member 201 is detached, and instead, a jig 210 is attached as illustrated in FIG. 14.

The jig 210 is detachably attached to the fork main body 202. Specifically, the jig 210 is detachably attached to the lower surface of the fork main body 202. The lower surface of the jig 210 is provided with the nozzle 123. Further, inside the jig 210, a jig internal flow path 211 is formed whose tip end is connected to the nozzle 123 and which allows gas to flow therethrough. When the jig 210 is attached to the fork main body 202, the nozzle 123 is made to communicate with the main body-side internal flow path 202a which constitutes the first internal flow path 130 together with the member-side internal flow path 201a via the jig internal flow path 211. Therefore, the main body-side internal flow path 202a constituting the first internal flow path 130 constitutes, together with the jig internal flow path 211, the second internal flow path 140 of the fork 120 illustrated in FIG. 4 and so on. In short, the main body-side internal flow path 202a serves as not only the adsorption flow path but also the nozzle flow path.

In the case of using the common exhaust mechanism 151 by the plurality of forks 200 as with the above example in FIG. 12, for example, if the adsorption member 201 of one of the forks 200 is replaced with the jig 210 and the adsorption member 201 of the other the fork 200 is kept attached, the state becomes as follows. Specifically, the intake pressure of the nozzle flow path including the jig internal flow path 211 of the jig 210 and the main body-side internal flow path 202a of the fork main body 202 in the one fork 200 varies according to the pressure of the gas flowing through the adsorption flow path including the member-side internal flow path 201a of the adsorption member 201 and the main body-side internal flow path 202a in the other fork 200.

Also in this case, for example, the flow rate sensor and the pressure sensor are provided on the first pipe 132 (see FIG. 6), and the determination on the state of the distance between the one fork 200 and the interferer only needs to be made based on the measurement results by the flow rate sensor and the pressure sensor in the one fork 200. Thus, even if ON/OFF of the adsorption is switched in the other fork 200 and the flow rate of the nozzle flow path varies as a result during the determination target period, the determination can be accurately made.

Note that the jig 210 is fixed to the fork main body 202, for example, by screwing. Besides, in the case where four adsorption members 201 in total are provided as explained above, the jig 210 is attached, for example, in place of the two adsorption members 201 on the tip end side of the fork 200. For the adsorption members 201 on the base end side of the fork 200 which are kept attached, their adsorption ports 121 are closed at the determination.

Figure 15:
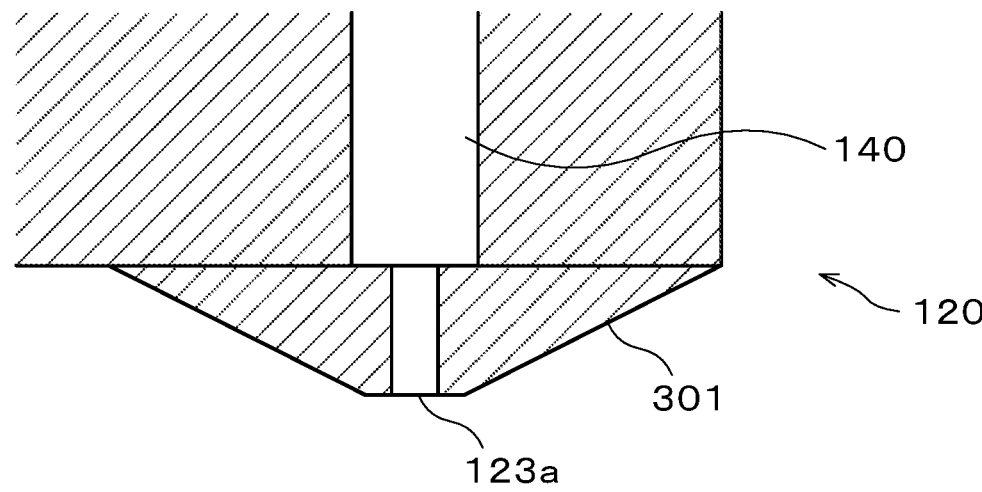
FIG. 15 is a view illustrating another example of the shape of the nozzle.

FIG. 15 is a view illustrating another example of the shape of the nozzle.

The shape of a nozzle 301 in FIG. 15 is a conical shape which gets thinner from the base end toward the tip end. By forming the shape, it is possible to make the nozzle 301 thick on its base end side while decreasing the area of the tip end surface of the nozzle 301.

If the area of the tip end surface of the fork 301 is large, the force of sucking gas by the nozzle 301 acts on the wafer W to suck it up in some cases when the tip end surface of the nozzle 301 is close to the upper surface of the wafer W below the nozzle 301, namely, below the fork 120. In contrast to this, by decreasing the area of the tip end surface of the nozzle 301, a region of the upper surface of the wafer W on which the force of sucking gas by the nozzle 301 acts decreases, thereby making it possible to decrease the total suction force acting on the wafer W. Therefore, it is possible to prevent sucking up of the wafer W.

Further, by increasing the nozzle 301 on the base end side, it is possible to prevent breakage or the like when the nozzle 301 comes into contact with the wafer W.

The determination on the state of the distance between the fork 120, 200 and the wafer W located below it is made in the above example, and a determination on the state of the distance between the fork 120, 200 and another member (for example, a structure or the like in the cassette C) located below it may be made.

Further, the nozzle 123, 301 may be provided on the front surface or the side surface of the fork, and a determination of the state of the distance between the fork and a member (for example, a back wall, a side wall or the like of the cassette C) located in a space on the front or the side may be made.

Besides, the nozzle 123, 301 is provided on the fork 120 of the transfer apparatus 20 in the above example, and the same nozzle may be provided at another portion (for example, the attachment member 113) of the transfer apparatus 20. Then, a determination on the state of the distance between the other portion of the transfer apparatus 20 and the interferer may be made. Besides, the same nozzle may be provided on another transfer apparatus such as the transfer apparatus 70 and a determination on the state of the distance between the other transfer apparatus and the interferer may be made.

The embodiments disclosed herein are examples in all respects and should not be considered to be restrictive. Various omissions, substitutions and changes may be made in the embodiments without departing from the scope and spirit of the attached claims.

According to this disclosure, it is possible to accurately make a determination on a state of a distance between a substrate holder which sucks and holds a substrate and an interferer.

What is claimed is:

1. A substrate transfer apparatus which transfers a substrate, the substrate transfer apparatus comprising:

one substrate holder configured to be able to adsorb and hold the substrate via an adsorption port;

a nozzle provided on a surface of the one substrate holder and configured to allow gas to pass therethrough;

an adsorption flow path connected to the adsorption port and configured to allow gas to flow therethrough at an adsorption time;

a nozzle flow path connected to the nozzle and configured to allow the gas to flow therethrough, the adsorption flow path of at least one of the one substrate holder and another substrate holder and the nozzle flow path being connected to a common gas suction mechanism;

a pressure sensor configured to measure a pressure of the gas flowing through the nozzle flow path; and a flow rate sensor configured to measure a flow rate of the gas flowing through the nozzle flow path, wherein the pressure sensor is separate from the flow rate sensor, the flow rate varying according to a distance between an interferer and the one substrate holder and the pressure of the gas flowing through the nozzle flow path.

2. The substrate transfer apparatus according to claim 1, further comprising a controller configured to make a determination on a state of the distance between the interferer and the substrate holder based on measurement results by the pressure sensor and the flow rate sensor.

3. The substrate transfer apparatus according to claim 2, wherein the controller is configured to make the determination from a relation between the measurement result by the pressure sensor and the measurement result by the flow rate sensor at a same time point.

4. The substrate transfer apparatus according to claim 3, wherein the controller is configured to make the determination based on whether a point set indicating the relation between the measurement result by the pressure sensor and the measurement result by the flow rate sensor at each time point during a determination target period falls within a predetermined reference region, on a two-dimensional plane using the pressure of the gas flowing through the nozzle flow path and the flow rate of the gas flowing through the nozzle flow path as axes.

5. The substrate transfer apparatus according to claim 1, wherein:

the adsorption flow path and the nozzle flow path are individually provided inside the one substrate holder;

the adsorption flow path and the nozzle flow path for the one substrate holder are connected to the common suction mechanism; and the pressure sensor is configured to measure the pressure of the gas flowing through the nozzle flow path, the pressure varying according to the pressure of the gas flowing through the adsorption flow path for the one substrate holder.

6. The substrate transfer apparatus according to claim 1, wherein:

the adsorption flow path for the other substrate holder and the nozzle flow path are connected to the common suction mechanism; and the pressure sensor is configured to measure the pressure of the gas flowing through the nozzle flow path, the pressure varying according to the pressure of the gas flowing through the adsorption flow path for the other substrate holder.

7. The substrate transfer apparatus according to claim 1, wherein:

the nozzle is provided at a jig attachable to and detachable from the one substrate holder;

when the jig is attached to the one substrate holder, the nozzle is connected to the adsorption flow path for the one substrate holder;

the adsorption flow path for the one substrate holder also serves as the nozzle flow path;

the adsorption flow path for the other substrate holder and the nozzle flow path are connected to the common suction mechanism; and the pressure sensor is configured to measure the pressure of the gas flowing through the nozzle flow path, the pressure varying according to the pressure of the gas flowing through the adsorption flow path for the other substrate holder.

8. The substrate transfer apparatus according to claim 7, wherein:

the one substrate holder has a main body provided with an internal flow path which constitutes the adsorption flow path in the one substrate holder;

the jig is provided with a jig internal flow path whose tip end is connected to the nozzle and which allows the gas to flow therethrough, the jig being detachably attached to the main body; and when the jig is attached to the main body, the nozzle is communicated with the internal flow path via the jig internal flow path.

9. The substrate transfer apparatus according to claim 1, further comprising a confluent pipe configured to join the adsorption flow path of the at least one of the one substrate holder and the another substrate holder and the nozzle flow path, wherein the at least one of the one substrate holder and the another substrate holder and the nozzle flow path is connected to the common gas suction mechanism via the confluent pipe.

10. The substrate transfer apparatus according to claim 1, wherein the adsorption flow path and the nozzle flow path are separate from each other.

11. The substrate transfer apparatus according to claim 1, wherein the nozzle and the adsorption port are provided on opposite sides in an up-down direction of the one substrate holder.

12. The substrate transfer apparatus according to claim 1, wherein the surface on which the nozzle is provided is adapted to be spaced apart and separated from the substrate held by the adsorption port.

13. A state determination method of a substrate transfer apparatus which transfers a substrate, the substrate transfer apparatus comprising:

one substrate holder configured to be able to adsorb and hold the substrate via an adsorption port;

a nozzle provided on a surface of the one substrate holder and configured to allow gas to pass therethrough;

an adsorption flow path connected to the adsorption port and configured to allow gas to flow therethrough at an adsorption time; and a nozzle flow path connected to the nozzle and configured to allow the gas to flow therethrough, the adsorption flow path of at least one of the one substrate holder and another substrate holder and the nozzle flow path being connected to a common gas suction mechanism, the state determination method comprising:

measuring, using a pressure sensor, a pressure of the gas flowing through the nozzle flow path;

measuring, using a flow rate sensor, a flow rate of the gas flowing through the nozzle flow path, wherein the pressure sensor is separate from the flow rate sensor; and making a determination on a state of a distance between an interferer and the substrate holder based on a measurement result of the pressure and a measurement result of the flow rate.

14. The state determination method according to claim 13, wherein the making of the determination makes the determination from a relation between the measurement result of the pressure and the measurement result of the flow rate.

15. The state determination method according to claim 14, wherein the making of the determination makes the determination based on whether a point set indicating the relation between the measurement result by the pressure sensor and the measurement result by the flow rate sensor at each time point during a determination target period falls within a predetermined reference region, on a two-dimensional plane using the pressure of the gas flowing through the nozzle flow path and the flow rate of the gas flowing through the nozzle flow path as axes.

16. The state determination method according to claim 13, wherein the adsorption flow path and the nozzle flow path are separate from each other.

17. The state determination method according to claim 13, wherein the nozzle and the adsorption port are provided on opposite sides in an up-down direction of the one substrate holder.

18. A computer-readable storage medium storing a program running on a computer of a controller which controls a substrate transfer apparatus which transfers a substrate, to cause the substrate transfer apparatus to execute a state determination method of the substrate transfer apparatus, the substrate transfer apparatus comprising:

one substrate holder configured to be able to adsorb and hold the substrate via an adsorption port;

a nozzle provided on a surface of the one substrate holder and configured to allow gas to pass therethrough;

an adsorption flow path connected to the adsorption port and configured to allow gas to flow therethrough at an adsorption time; and a nozzle flow path connected to the nozzle and configured to allow the gas to flow therethrough, the adsorption flow path of at least one of the one substrate holder and another substrate holder and the nozzle flow path being connected to a common gas suction mechanism, and the state determination method comprising:

measuring, using a pressure sensor, a pressure of the gas flowing through the nozzle flow path;

measuring, using a flow rate sensor, a flow rate of the gas flowing through the nozzle flow path, wherein the pressure sensor is separate from the flow rate sensor; and making a determination on a state of a distance between an interferer and the substrate holder based on a measurement result of the pressure and a measurement result of the flow rate.

19. The computer-readable storage medium according to claim 18, wherein the adsorption flow path and the nozzle flow path are separate from each other.

20. The computer-readable storage medium according to claim 18, wherein the nozzle and the adsorption port are provided on opposite sides in an up-down direction of the one substrate holder.

* * * * *